United States Patent
Baba

(10) Patent No.: US 8,519,805 B2
(45) Date of Patent: Aug. 27, 2013

(54) ELECTRONIC CIRCUIT

(75) Inventor: Osamu Baba, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 49 days.

(21) Appl. No.: 13/283,979

(22) Filed: Oct. 28, 2011

(65) Prior Publication Data
US 2012/0105169 A1 May 3, 2012

(30) Foreign Application Priority Data
Oct. 29, 2010 (JP) .................................. 2010-244454

(51) Int. Cl.
*H03H 7/38* (2006.01)
(52) U.S. Cl.
USPC ............................................. 333/33; 333/35
(58) Field of Classification Search
USPC ............................ 333/32, 33, 34, 35, 238, 246
See application file for complete search history.

(56) References Cited

U.S. PATENT DOCUMENTS

| | | | | |
|---|---|---|---|---|
| 6,307,525 | B1 * | 10/2001 | Bateman et al. | 343/853 |
| 7,358,830 | B2 * | 4/2008 | Hacker | 333/34 |
| 8,164,400 | B2 * | 4/2012 | Iwata et al. | 333/204 |
| 2003/0063428 | A1 | 4/2003 | Nishi | |
| 2008/0030286 | A1 * | 2/2008 | Park et al. | 333/126 |

FOREIGN PATENT DOCUMENTS
JP 2003-110023 A 4/2003

* cited by examiner

*Primary Examiner* — Stephen Jones
(74) *Attorney, Agent, or Firm* — Westerman, Hattori, Daniels & Adrian, LLP

(57) ABSTRACT

An electronic circuit includes a first transmission line connected to a DC power source, a second transmission line having one end connected to the first transmission line at a connecting node, a narrow portion formed in the second transmission line and provided at a position that is away from a specific position by equal to or greater than ⅛ wavelength of a signal, the specific position being away from the connecting node at a distance equal to ¼ wavelength, and a capacitor having one end connected to the other end of the second transmission line and the other end connected to a reference potential.

9 Claims, 3 Drawing Sheets

ELECTRONIC CIRCUIT

CROSS-REFERENCE TO RELATED APPLICATION

This application is based upon and claims the benefit of priority of the prior Japanese Patent Application No. 2010-244454, filed on Oct. 29, 1010, the entire contents of which are incorporated herein by reference.

BACKGROUND (i) Technical Field

A certain aspect of the embodiments discussed herein is related to an electronic circuit.

(ii) Related Art

Electronic circuits such as monolithic microwave integrated circuits (MMICs) are used in radio frequency (RE) or high frequency circuits, which handle RF signals such as filter circuits and impedance matching circuits. MMICs have a circuit pattern of a transmission line made of a metal such as gold (Au) formed on an insulation film on a semiconductor substrate and circuit elements formed thereon. Examples of the circuit elements included in MMICs are a field effect transistor (FET), a capacitor such as a metal-insulator-metal (MIM) capacitor, a resistor, a distributed-constant line, and an inductor.

The MIM capacitor is required to have improved reliability, and is proposed in, for example, Japanese Patent Application Publication No. 2003-110023.

If the MIM capacitor becomes defective, the MIM capacitor may fall in a short-circuited state in which a huge amount of current flows to a transmission line connected to the MIM capacitor and may fuse the transmission line. The position of fusing depends on various factors, which may include the shape of the transmission line and the fabrication process. When the transmission line is fused, a remainder of the transmission line may function as an open stub and may affect the characteristics of the electronic circuits greatly. A similar problem occurs in a case where a capacitor other than the MIM capacitor is used.

SUMMARY

According to an aspect of the present invention, there is provided an electronic circuit including: a first transmission line connected to a DC power source; a second transmission line having one end connected to the first transmission line at a connecting node; a narrow portion formed in the second transmission line and provided at a position that is away from a specific position by equal to or greater than ⅛ wavelength of a signal, the specific position being away from the connecting node at a distance equal to ¼ wavelength; and a capacitor having one end connected to the other end of the second transmission line and the other end connected to a reference potential.

DETAILED DESCRIPTION

Figure 1:
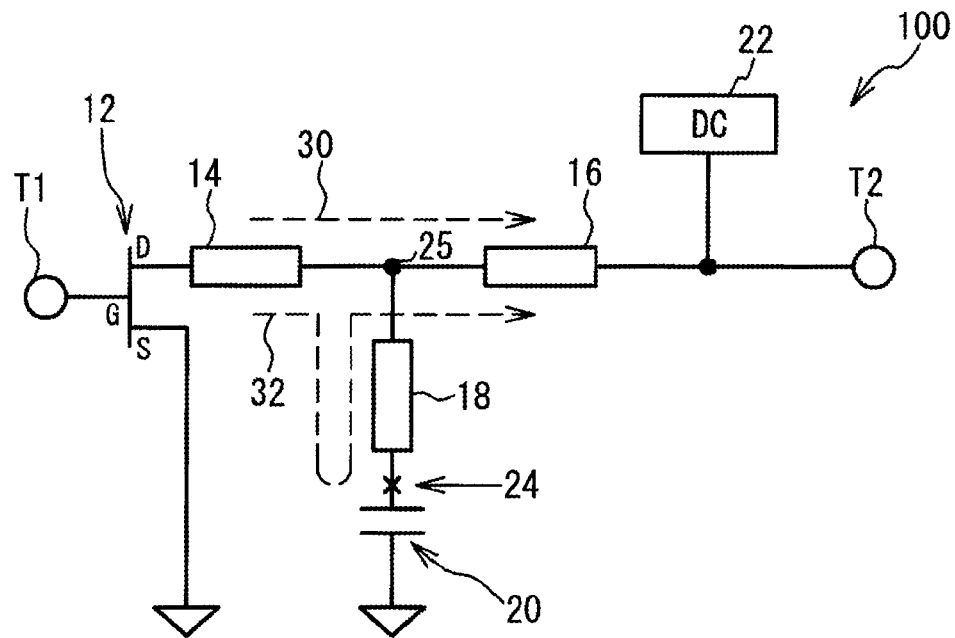
FIG. 1 is a schematic diagram of a configuration of an electronic circuit in accordance with a comparative example.

A comparative example is now described for comparison with embodiments. FIG. 1 is a schematic diagram of an electronic circuit 100 in accordance with a comparative example. The electronic circuit 100 includes an input terminal T1, an FET 12, a transmission line 14, a transmission line 16, a transmission line 18, an MIM capacitor 20, a direct current (DC) power source 22 and an output terminal T2. A signal such as an RF signal is input to the input terminal T1. The gate terminal G of the FET 12 is connected to the input terminal T1, and the source terminal S thereof is grounded, the drain terminal D being connected to one end of the transmission line 14. The above connections of the gate, source and drain terminals of the FET 12 are exemplary connections and may be replaced with different connections. The FET 12 may be replaced with a bipolar transistor. The other end of the transmission line 14 is connected to one end of the transmission line 16. In the following, when there is no need to distinguish the transmission lines 14 and 16 from each other, these transmission lines are referred to as a main line. The length of the transmission line 18 is ¼ of the wavelength of a signal 30 transmitted through the main line. One end of the transmission line 18 is connected to the main line in such a way to form a T circuit. The main line and the transmission line 18 are connected together at a connecting node 25. Although the transmission lines 14, 16 and 18 are separately illustrated in FIG. 1, these transmission lines are integrally formed with each other on the real substrate. The other end of the transmission line 18 is connected to one end of the MIM capacitor 20. The other end of the MIM capacitor 20 is grounded. The other end of the transmission line 16 is connected to the output terminal T2. The DC power source 22 is connected to the other end of the transmission line 16, and supplies DC power.

The electronic circuit 100 has a circuit configuration that functions as an amplifier with a filter circuit or an impedance matching circuit. In a case where the electronic circuit 100 is an amplifier with a filter circuit, the transmission lines 14, 16 and 18 and the MIM capacitor 20 pass only signals having predetermined frequency components included in the RF signal output by the transistor 12, and apply the filtered signals to the output terminal T2. In a case where the electronic circuit 100 is an amplifier with an impedance matching circuit, the transmission lines 14, 16 and 18 and the MIM capacitor 20 match the output impedance of the transistor 12 and the input impedance of a circuit connected to the output terminal T2 with each other.

A description is now given of a case where the MIM capacitor 20 becomes defective in the electronic circuit 100. The MIM capacitor 20 may fail due to a high voltage applied across the MIM capacitor 20. In this case, the MIM capacitor 20 falls in the short-circuited state in DC operation. Thus, a huge amount of current flows through a path that starts from the DC power source 22 and includes the transmission line 18 and the MIM capacitor 20. Thus, the transmission line 18 may be fused somewhere.

It is now assumed that the transmission line 18 is fused at a position indicated by a reference numeral 24. The remaining portion of the transmission line 18 closer to the main line functions as an open stub with respect to the main line. Thus, the signal 30 transmitted through the main line is affected by a signal reflected at the fused position 24. The signal reflected at the fused position 24 is indicated by a broken line 32. In case where the remainder of the transmission line 18 closer to the main line has a length equal to ¼ of the wavelength λ of the signal 30 transmitted through the main line, open-end reflection takes place at the fused position 24. The connecting node 25 between the main line and the transmission line 18 is short-circuited in RF operation. In this case, the signal 30 is totally reflected at the connecting node 25, and the output signal of the FET 12 does not reach the output terminal T2. Even when the fused position 24 is different from the position where λ/4 stands, the signal transmission to the output terminal T2 is blocked more greatly as the fused position is closer to λ/4. As described above, in some cases, the characteristics of the electronic circuit are greatly affected by the fused position of the transmission line 18. However, the comparative example does not have any means for identifying or predicting the fused position 24 before it happens.

A description is given of embodiments with reference to the accompanying drawings.

First Embodiment

Figure 2:
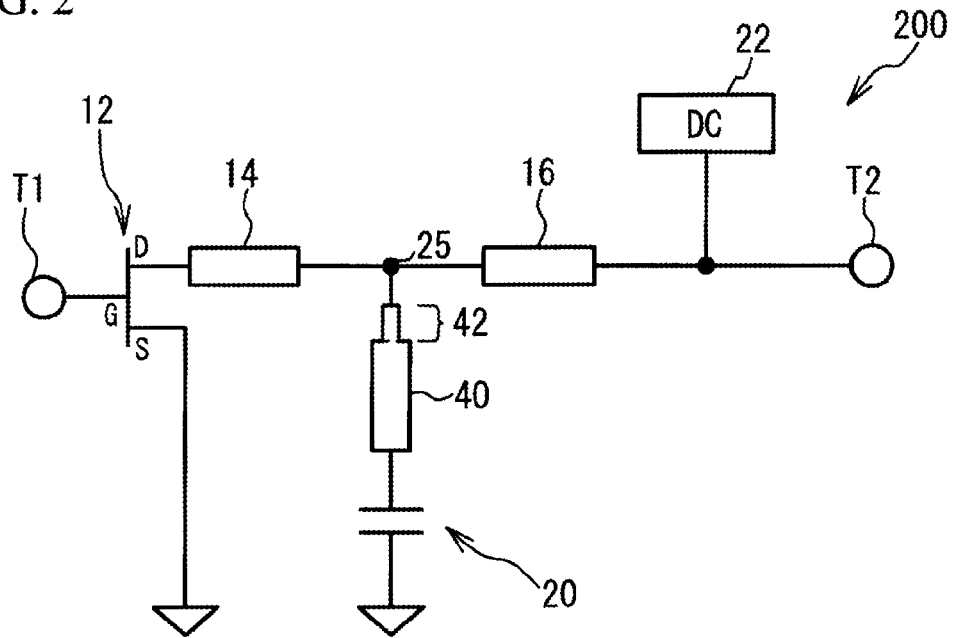
FIG. 2 is a schematic diagram of an exemplary configuration of an electronic circuit in accordance with a first embodiment.

FIG. 2 is a schematic diagram of an electronic circuit 200 in accordance with a first embodiment. In FIG. 2, parts that are the same as those illustrated in FIG. 1 are given the same reference numerals, and a description thereof is omitted here. The electronic circuit 200 differs from the electronic circuit 100 in that a transmission line 40 is substituted for the transmission line 18. One end of the transmission line 40 is connected to the main line, and the other end is connected to one end of the MIM capacitor 20. The transmission line 40 has a narrow portion 42, which is located in the end portion of the transmission line closer to the main line and is narrower than the remaining portion thereof. The narrow portion of the transmission line 40 contacts the main line. The cross section of the narrow portion 42 is smaller than that of the remaining portion of the transmission line 40. The length of the transmission line 40 is equal to ¼ of the wavelength of the signal transmitted through the main line, as in the case of the comparative example. The transmission lines 14, 16 and 40 are integrally formed so as to form a T circuit on the real substrate.

A case where MIM capacitor 20 becomes defective in the electronic circuit 200 is now considered. In this case, a huge amount of current flows to the path that includes the transmission line 40 and the MIM capacitor 20. At this time, the narrow portion 42 of the transmission line 40 is narrower than the remaining portion, and has a comparatively larger current density. Thus, the narrow portion is fused more easily than the remaining portion. As has been described previously, the narrow portion 42 is provided in the end of the transmission line 40. In case where the narrow portion 42 is fused, no remainder of the transmission line 40 is connected to the main line. The open stub is not formed with the remainder of the transmission line 40, and signal reflection does not occur. That is, the first embodiment does not have the problems of the comparative example.

When the transmission line 40 is fused at the narrow portion 42, the transmission line 40 and the MIM capacitor 20 are separated from the main line. Thus, the electronic circuit 200 loses the functions of the filter circuit or the impedance matching circuit. However, the output of the FET 12 is continuously available at the output terminal T2. Thus, the electronic circuit 200 is not affected greatly by short-circuiting of the MIM capacitor 20, as compared with the comparative example illustrated in FIG. 1.

Figure 3:
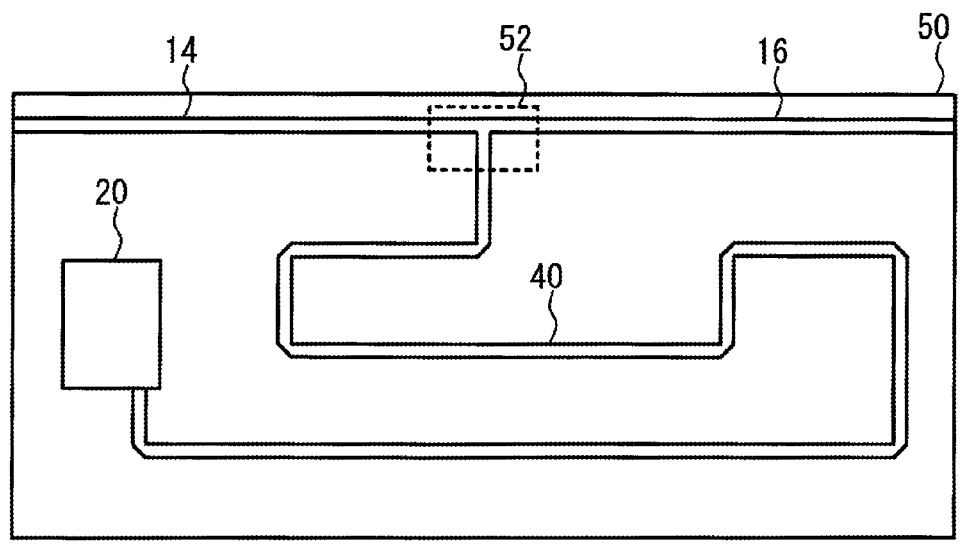
FIG. 3 is a schematic diagram of a pattern on a substrate of the electronic circuit in accordance with the First Embodiment.

FIG. 3 is a diagram of an exemplary pattern formed on a substrate 50 of the electronic circuit 200 in accordance with the first embodiment. FIG. 3 illustrates a part of the pattern formed on the substrate 50. More particularly, FIG. 3 illustrates a part of the pattern that includes the transmission lines 14, 16 and 40 and the MIM capacitor 20. The substrate 50 may be an insulation substrate made of an insulator such as polyimide, or a semiconductor substrate made of, for example, Si or GaAs. The transmission lines 14, 16 and 40 are made of a metal such as gold. The MIM capacitor 20 has a structure in which an insulation film made of, for example, SiN is sandwiched between an underlying electrode and an upper electrode. The underlying electrode of the MIM capacitor 20 is electrically connected to a ground provided on the back surface of the substrate 50 by using a via that pierces the substrate 50.

As a typical example, the substrate 50 is a semiconductor substrate made of GaAs. A semiconductor device such as FET is formed on the substrate 50. A multilayer transmission line pattern is formed on the substrate 50 in which polyimide is interposed between vertically adjacent transmission layers. The transmission lines 14, 16 and 40 are included in the multilayer transmission line pattern. The MIM capacitor 20 is provided on an insulation film made of, for example, SiN on the substrate 50. The transmission lines 14, 16 and 40 are provided on an identical wiring layer, while the MIM capacitor 20 may be provided on a layer different from the layer on which the transmission lines 14, 16 and 40 are provided. In FIG. 3, the transmission lines 14, 16 and 40 and the MIM capacitor 20 are illustrated without consideration of the difference in layer. A portion 52 defined by a broken line in FIG. 3 will be described later with reference to FIGS. 4 and 5.

Figure 4:
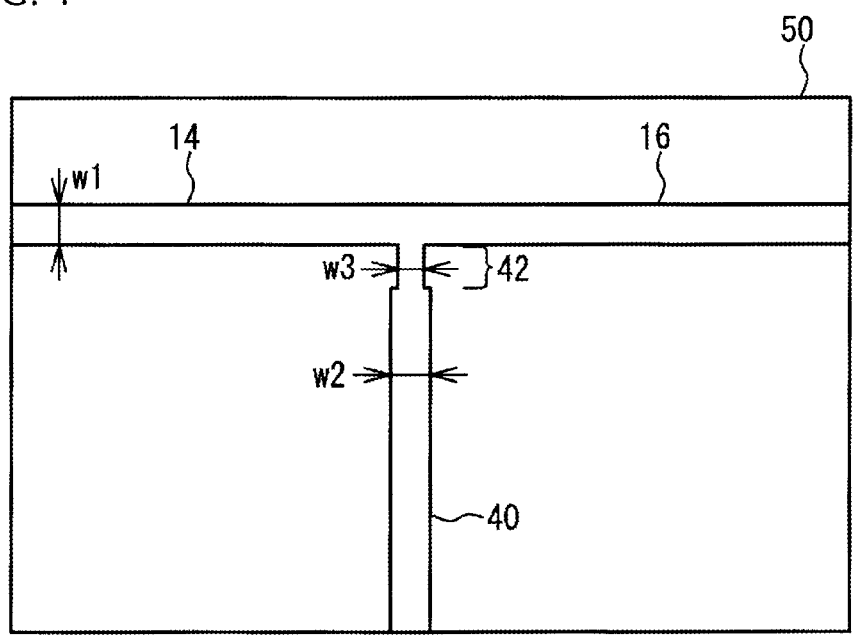
FIG. 4 is a schematic enlarged view of a portion depicted by a broken line in FIG. 3 and illustrates an exemplary pattern of a transmission line in accordance with the first embodiment.

FIG. 4 illustrates an exemplary pattern of the transmission lines 14, 16 and 40 employed in the first embodiment, and corresponds to an enlargement of the portion 52. In FIG. 4, parts that are the same as those illustrated in FIGS. 2 and 3 are given the same reference numerals, and a description thereof is omitted here. Referring to FIG. 4, the width w1 of the main line composed of the transmission lines 14 and 16 and the width w2 of the transmission line 40 are 6 μm, for example. The transmission lines 14, 16 and 40 are configured to have a characteristic impedance of 50Ω, for example. The narrow portion 42 of the transmission line 40 closer to the main line has a width w3 smaller than the width w2 of the remaining portion of the transmission line 40. The width w3 of the narrow portion 42 is 4 μm, for example. The narrow portion 42 contacts the main line. Thus, in case where a huge amount of current flows through the transmission line 40, the narrow portion 42 may be fused more easily than the remaining portion thereof. The widths w1, w2 and w3 are not limited to the above values but may have different values. For example, the widths w1 and w2 may differ from each other.

Second Embodiment

Figure 5:
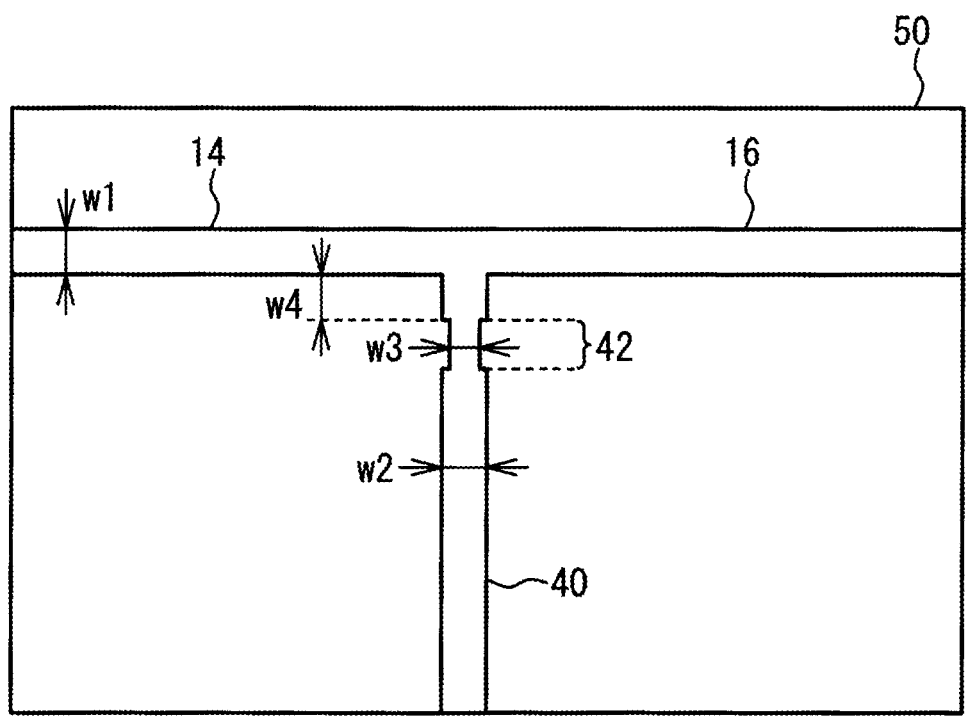
FIG. 5 is a schematic enlarged view of a portion depicted by a broken line in FIG. 3 and illustrates an exemplary pattern of a transmission line in accordance with a second embodiment.

FIG. 5 illustrates an exemplary pattern of the transmission lines 14, 16 and 40 in accordance with a second embodiment and corresponds to an enlarged view of the portion 52 in FIG. 3. The configuration illustrated in FIG. 5 differs from that in FIG. 4 in that the narrow portion 42 is away from the main line at a distance w4. The other portions of the configuration illustrated in FIG. 5 are the same as those illustrated in FIG. 4, and a description thereof is omitted here.

The lines are fused by an instantaneous flow of a huge amount of current. Thus, the periphery of the fused portion may be affected. For example, in FIG. 1, the material of the transmission line may scatter and adhere to the main line at the time of fusing. There is another possibility that part of the main line may be removed due to heat in fusing and the width w1 may be narrowed.

In contrast, according to the second embodiment, the narrow portion 42 is away from the main line, as illustrated in FIG. 5. It is thus possible to avoid the occurrence of scattering of the material of the lines and partial removal of the main line.

In case where there is a large distance w4 between the narrow portion 42 and the main line, the remaining portion of the transmission line 40 close to the main line after fusing may function as an open stub. This is not desired and may cause problems similar to those of the comparative example.

With the above in mind, it is preferable that the distance w4 between the narrow portion 42 and the main line is as small as possible. According to an aspect, it is preferable that the distance w4 is equal to or less than ⅛ of the wavelength of the signal transmitted through the main line. In this case, a 70% signal passage has been confirmed, as compared with the case where the distance w4 is ¼ of the wavelength thereof (total reflection). It is possible to set the distance w4 equal to or less than ⅛ of the wavelength of the signal transmitted through the main line.

The length of the transmission line 40 in the first and second embodiments is equal to ¼ of the wavelength of the signal transmitted over the main line. However, the length of the transmission line 40 is not limited to the above but may be ½ of the wavelength of the signal transmitted through the main line. In this case, like the first and second embodiments, the distance w4 between the narrow portion 42 and the main line is equal to or less than ⅛ of the wavelength of the signal transmitted through the main line. Further, the narrow portion 42 may be positioned at a distance equal to or greater than ⅜ of the wavelength of the signal transmitted over the main line. Even if the length of the transmission line 40 is less than ¼ of the wavelength, the effects of the presence of the narrow portion 42 become more conspicuous as the total length is closer to ¼ of the wavelength.

In view of the above consideration, the expected effects of the embodiments can be obtained in such a manner that the narrow portion 42 is provided at positions that are away from the specific position at distances equal to or greater than ⅛ of the wavelength, wherein the specific position is away from the connecting node 25 at a distance equal to ¼ of the wavelength. In other words, the effects of the embodiments can be expected in such a manner that the narrow portion is provided at a position away from the connecting node 25 at a distance equal to or less than ⅛ of the wavelength or at a position away from the connecting node 25 at a distance equal to or greater than ⅜ of the wavelength. The narrow portion 42 may be provided at positions that are away from the specific position at distances equal to or greater than ⅙ of the wavelength, wherein the specific position is away from the connecting node 25 at a distance equal to ¼ of the wavelength. In other words, the narrow portion may be provided at a position away from the connecting node 25 at a distance equal to or less than 1/12 of the wavelength or at a position away from the connecting node 25 at a distance equal to or greater than 5/12 of the wavelength.

As described above, the present embodiment has the main line (composed of the transmission lines 14 and 16), which may be defined as a first transmission line, the transmission line 40, which may be defined as a second transmission line, and the MIM capacitor 20. The main line is connected to the DC power source 22. The transmission line 40 is connected to the main line via one end, and is connected to one end of the MIM capacitor 20 via the other end. The end of the transmission line 40 connected to the main line has the narrow portion 42. The narrow portion 42 is provided at positions that are away from the specific position at distances equal to or greater than ⅛ of the wavelength, wherein the specific position is away from the connecting node 25 at a distance equal to ¼ of the wavelength. The MIM capacitor 20 is connected to the other end of the transmission line 40 via one end, and is grounded via the other end. In case where the MIM capacitor 20 is short-circuited, the transmission line 40 may be fused easily in the narrow portion 42. The presence of the narrow portion 42 makes it possible to reduce the influence of short-circuiting of the MIM capacitor 20 to the electronic circuit 200, as compared with the comparative example.

The electronic circuit 200 of the first and second embodiments has the T circuit composed of the main line and the transmission line 40. The first and second embodiments may be varied so as to have a π circuit that includes multiple lines, each of which includes the transmission line 40 and the MIM capacitor 20.

According to the first embodiment, the narrow portion 42 is provided in the end of the transmission line 40 closer to the main line and is in contact with the main line. According to the second embodiment, the narrow portion 42 is away from the node at which the connection with the main line is made. According to the first and second embodiments, it is possible to prevent the material of the transmission line from scattering and adhering to the main line at the time of fusing and to prevent the characteristic impedance of the main line from being changed due to partial removal of the main line.

The other end of the MIM capacitor 20 is connected to the reference potential, which may be the ground potential. The other end of the MIM capacitor 20 may be connected to a predetermined potential that forms a potential difference with the DC power source 22.

The MIM capacitor 20 may be replaced by another type of capacitor such as a chip condenser. However, the present invention is particularly advantageous when the MIM capacitor is used, because HIM capacitor does not have strong resistance to electrostatic discharge (ESD) although the MIM capacitor may be incorporated in the semiconductor devices easily.

The first and second embodiments are not limited to the electronic circuit 200 in which the FET 12 is combined with the filter circuit or the impedance matching circuit but includes another configuration.

The present invention is not limited to the specifically described embodiments but includes other embodiments and variations within the scope of the claimed invention.

What is claimed is:

1. An electronic circuit comprising:
   a first transmission line connected to a DC power source;
   a second transmission line having one end connected to the first transmission line at a connecting node;
   a narrow portion formed in the second transmission line and provided at a position that is away from a specific position by equal to or greater than ⅛ wavelength of a signal, the specific position being away from the connecting node at a distance equal to ¼ wavelength; and
   a capacitor having one end connected to the other end of the second transmission line and the other end connected to a reference potential.

2. The electronic circuit according to claim 1, wherein the signal is transmitted through the first transmission line.

3. The electronic circuit according to claim 1, wherein the first transmission line and the second transmission line form a T circuit.

4. The electronic circuit according to claim 1, wherein the narrowed portion contacts the first transmission line.

5. The electronic circuit according to claim 1, wherein the narrowed portion is provided away from the first transmission line.

6. The electronic circuit according to claim 1, wherein the reference potential is a ground potential.

7. The electronic circuit according to claim 1, wherein the capacitor is an MIM capacitor.

8. The electronic circuit according to claim 1, wherein an output terminal of a transistor is connected to the one end of the first transmission line.

9. The electronic circuit according to claim 1, wherein the first transmission line, the second transmission line and the capacitor form one of a filter circuit and an impedance matching circuit.

* * * * *